United States Patent [19]

Allen, Jr. et al.

[11] 4,284,963
[45] Aug. 18, 1981

[54] ETALON LASER DIODE

[75] Inventors: Louis B. Allen, Jr., Florissant; Herbert G. Koenig, Jr., St. Charles; Robert R. Rice, Florissant, all of Mo.

[73] Assignee: McDonnell Douglas Corporation, St. Louis, Mo.

[21] Appl. No.: 69,388

[22] Filed: Aug. 24, 1979

[51] Int. Cl.³ .............................................. H01S 3/19
[52] U.S. Cl. .......................... 331/94.5 H; 331/94.5 C
[58] Field of Search ...................... 331/94.5 H, 94.5 C

[56] References Cited

U.S. PATENT DOCUMENTS 3,303,431   2/1967   Fowler ........................... 331/94.5 H Primary Examiner—James W. Davie
Attorney, Agent, or Firm—George W. Finch; Walter J. Jason; Donald L. Royer

[57] ABSTRACT

A laser diode suitable for integrated and fiber optic applications requiring single transverse and single longitudinal mode operation. The single transverse mode is provided by making a gallium arsenide double heterostructural laser diode with a narrow stripe width and a relatively long length. The single longitudinal mode operation is provided by cracking the diode transverse to the stripe at one or more locations to form internal etalons in the laser cavity.

19 Claims, 11 Drawing Figures

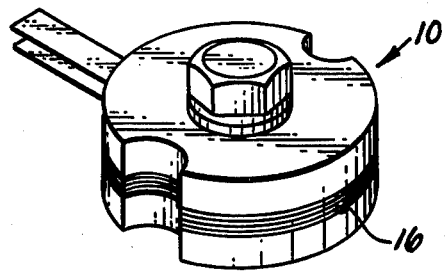
FIG_1
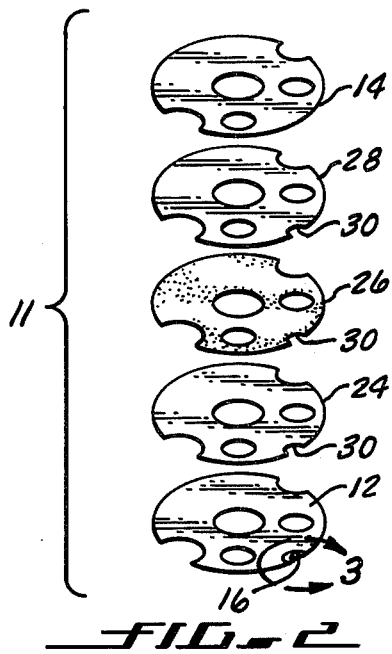
FIG_2
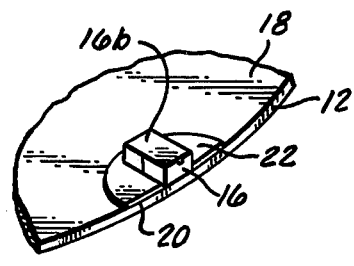
FIG_3
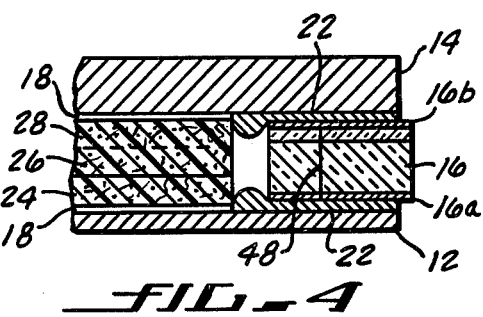
FIG_4
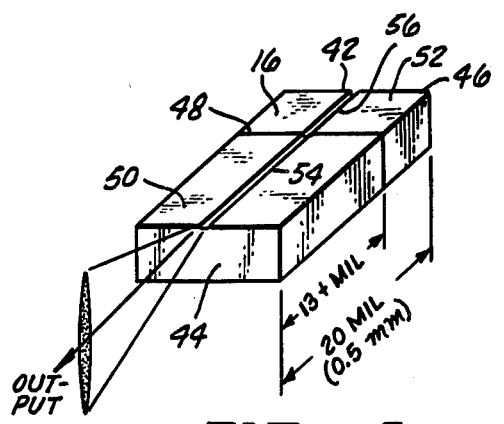
FIG_6
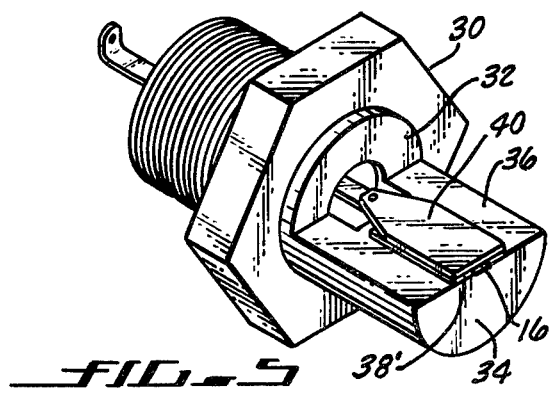
FIG_5

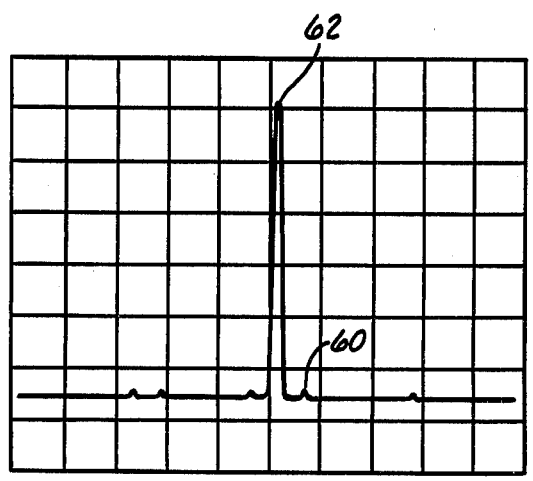
FIG_7
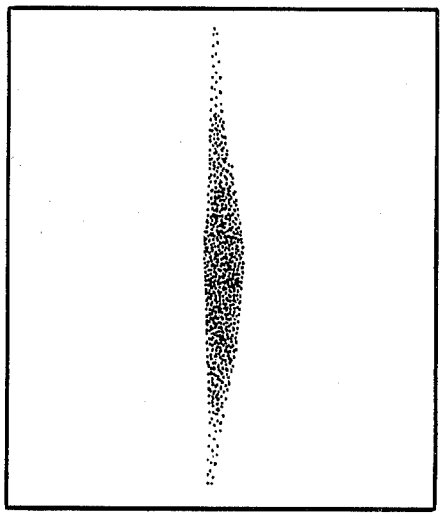
FIG_8

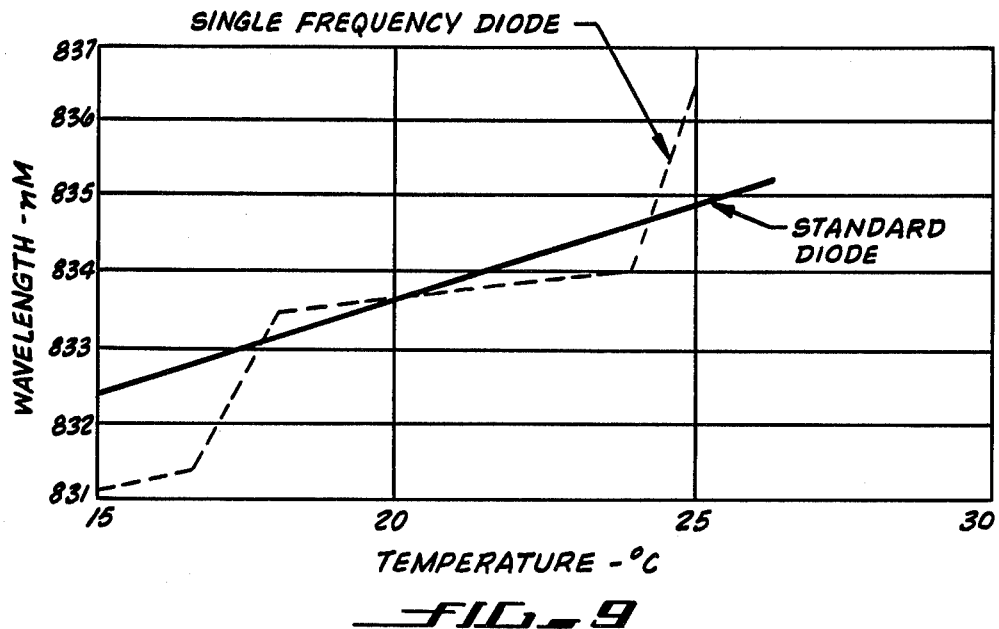
FIG_9
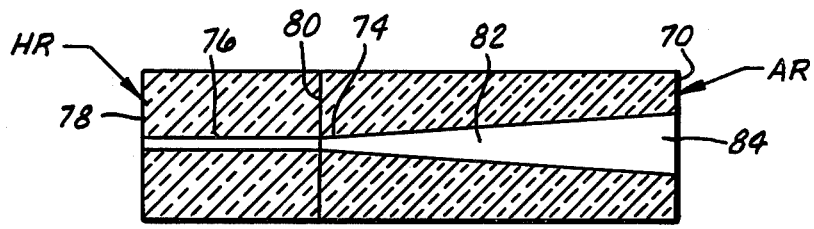
FIG_10
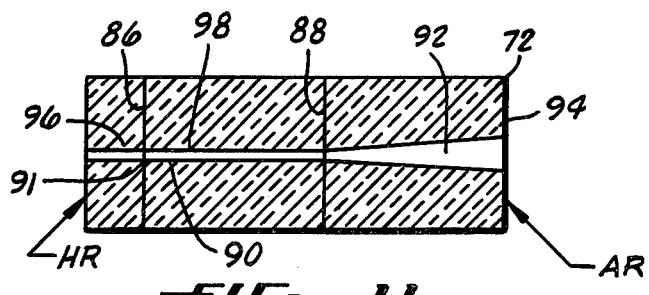
FIG_11

ETALON LASER DIODE

BACKGROUND OF THE INVENTION

There are a number of integrated optical signal processors and fiber optic devices currently being developed or proposed that require a semiconductor diode laser source operating in a single longitudinal and fundamental transverse mode. Some examples of applications include an integrated optical RF spectrum analyzer, integrated optical and bulk optical wideband correlators, and laser fiber gyroscopes. Moreover, modulated versions of the single mode diode laser are required for long haul, single mode, fiber optic data links operating at very high data rates (1 Gbps), both because the narrow spectrum permits optical pulse propagation with a minimum of temporal dispersion and the optical response of such a laser diode is essentially free of relaxation oscillations. In integrated optical or bulk optical single processor applications, multimode oscillation either longitudinal or transverse leads to loss of resolution and reduced dynamic range. In fiber optic applications, multi-transverse mode operation results in reduced efficiency and coupling to single mode optical fibers and increased pulse dispersion. Therefore, there has been required the development of a single longitudinal and single transverse mode laser diode that can be mounted in a rugged, environmentally stable package capable of long life at room temperature and that can operate at an exceptionally low threshold and high efficiency.

The technology of the growth of gallium arsenide double heterostructure laser diodes has progressed to the point where a reasonably uniform state-of-the-art now exists among a number of sources of laser diode material. High quality double heterostructural structure wafers fabricated by liquid phase epitaxy yield broad area current thresholds of about 1000 A/cm$^2$. At least five manufacturers (ITT Electro-Optical Products Division, RCA Incorporated, Laser Diode Laboratories Incorporated and Spectronix Incorporated) offer CW laser diodes with oxide striped current confinement having nearly identical current and output specifications. These diodes operate at threshold currents of 100 to 200 mA and 10 mW output when operated 100 mA over threshold. In spite of this uniformity in operating parameters, none of these available diodes are acceptable for use in many critical integrated optical circuit or single mode fiber applications. The difficulty is that two critical areas, the achievement of reliable single longitudinal mode oscillation, i.e., single frequency operation, and adequate control of the diode transverse spatial mode pattern are lacking in these devices.

Several diode manufacturers have sought to get around these problems by reducing the area of current confinement through the introduction of buried mesa or etch well of a width which is typically 0.5 to 2 μm. The disadvantages of this procedure are the increased cost and the reduction of diode output power to only 1 or 2 mW. An advantage does result for end fire coupling into a fiber in that a more symmetrical beam shape is produced but part of this advantage is negated by the low numerical aperture of the single mode fibers into which this type of diode is usually coupled. Conversely, integrated optical circuits naturally accommodate a nonsymmetric output beam. The optical power required by integrated optical circuits is generally several milliwatts, whereas that required for long fiber optic links having high data rates and low bit error rates can exceed 10 mW. Each requires a laser diode of 10 to 25 mW output power when coupling losses are considered.

Heretofore the solutions to the difficult technical problem of achieving a reliable single mode oscillation, i.e., single frequency operation, involve the use of distributed feedback structures in the laser cavity to act as frequency sensitive filters or the control of doping levels in the active region. However, because of the losses inherent with the reported techniques, they are not consistent with low threshold CW room temperature operation with high efficiency. The other major problem area has been the control of diode transverse spatial mode pattern. Many exotic resonator designs heretofore reported for transverse mode selection employ tilted or curved stripes or filamentary resonators. These techniques increase resonator loss and hence adversely affect lasing threshold and efficiency. Additionally, the required packaging and environmental stability has been lacking in the prior art. However, this in some measure can be overcome through the use of the concepts embodied in U.S. Patent Application Ser. No. 069,311 entitled "Heat Sink Laser Diode" by Allen et al, filed Aug. 24, 1979 and assigned to Applicants' assignee.

Typically, to create a laser diode one must have a PN junction in which electrons are injected across the junction followed by recombination of electrons and holes to generate photons. For lasing to occur, a spontaneous emitted photon must transverse the cavity formed by the semiconductor material and the natural mirrors at the opposite ends thereof with sufficient gain to avoid attenuation. In a heterostructure laser diode, the carriers are confined in an active region by a potential barrier to reduce the temperature dependence of the threshold as well as its value. The barrier is created by putting in material with a higher energy gap near the junction. The most widely used of such materials are gallium arsenide and aluminum arsenide.

BRIEF DESCRIPTION OF THE SHOWN EMBODIMENT

Reduced temperature dependence is critical for continuous lasing at room operation. For continuous operation, a structure is needed which maximizes heat dissipation by combining the double heterostructure with striped geometry so that CW operation can be achieved over a wide temperature range. The striped geometry heterostructure laser has its output in a single filament producing a better defined mode distribution. Once such a diode is formed, an internal etalon is formed by cracking the single diode chip so that an etalon is produced in the optical cavity. In practice, the two pieces are not physically separated, but are held together by one of the metallic electrical contact surfaces on the diode which is not physically broken. The diodes are configured having a stripe which is long enough to operate in the lowest order geometric mode but not in a single longitudinal mode. The diode is broken into two pieces usually of an unequal ratio so that the cavity resonances occur more than two nanometers apart in wavelength rather than the normal 0.2 nanometers. The net result is a diode having a gain center stability of 0.25 nanometers per degree which stability range is several times better than conventional laser diodes.

In a modified form, a striped diode is produced with a trumpet shaped front section separated from a standard striped section by the internal etalon. Diodes constructed in this manner are capable of producing up to 100 mW of useable defraction limited optical power. A similar diode can be produced but with a longer rear section so that more than one internal etalon may be used to provide a very high power diode oscillating in a single longitudinal mode.

It is therefore an object of the present invention to provide a semiconductor laser diode which can be operated in a controlled mode over a wide output power range.

Another object is to provide a miniature replacement for gas laser systems.

Another object is to provide a laser diode having a reliable single longitudinal mode oscillation without resort to exotic multilayered dielectric coatings or other inherently lossy and exotic devices and technology.

Another object is to produce a laser diode which can be constructed to control the transverse spatial mode pattern without resort to tilted or curved stripes or filamentary resonators.

Another object is to provide laser diodes configured as oscillator-amplifier systems.

Another object is to provide a highly efficient diode which operates at a single frequency and whose temperature stability is better than that of laser diodes presently available.

Another object is to provide an improved laser diode which can be constructed utilizing readily available techniques for manufacture.

Another object is to achieve the geometric properties of long laser diodes while the wavelength properties of very short diodes are obtained.

Another object is to provide a single mode, CW room temperature laser diode which easily can be mounted on a heat sink which is relatively rugged and can be optically coupled with a minimum of expense.

These and other objects and advantages of the present invention will become apparent to those skilled in the art after considering the following detailed specification which covers preferred embodiments thereof in conjunction with the accompanying drawings wherein:

BRIEF DESCRIPTION OF THE DRAWINGS

FIG. 1 is a perspective view of a packaged etaloned diode constructed according to the present invention;

FIG. 2 is an exploded view of a typical etalon diode assembly with its heat sink shown;

FIG. 3 is an enlarged detailed view taken at FIG. 3—3 of FIG. 2;

FIG. 4 is a cross-sectional view taken through the diode mounted as shown in FIGS. 1 and 2;

FIG. 5 is a perspective view of an alternate arrangement for mounting the diode in a modified TO-5 package;

FIG. 6 is a diagrammatic representation of the etaloned laser diode of the present invention in operation;

FIG. 7 is a graph of the frequency spectrum produced by a diode of the present invention;

FIG. 8 is the far field illumination produced by a diode constructed according to the present invention;

FIG. 9 is a graph of wavelength versus temperature comparing the stability of a standard diode in solid line with the stability of a diode constructed according to the present invention in dashed line;

FIG. 10 is a diagrammatic view of the stripe configuration of a modified embodiment of the present invention adapted for optical recording applications; and FIG. 11 is a diagrammatic representation of the stripe configuration of a signal processing configuration of a diode constructed according to the present invention.

DETAILED DESCRIPTION OF THE SHOWN EMBODIMENTS

Referring to the drawings more particularly by reference numbers, number 10 in FIG. 1 refers to an etalon laser diode package. The package 10 includes a diode mounting assembly 11 as shown in FIG. 2. The package in 11 includes a pair of diode mounting plates 12 and 14 on which the etaloned laser diode 16 eventually is attached by its metal contacts 16a and 16b. The plates 12 and 14 preferably are constructed from a good heat conducting material such as copper which has been gold-plated on its surfaces to assure good electrical contact. The plates 12 and 14 are coated with photoresist layers 18 except for the diode mounting areas 20 which thereafter are coated with solder to form a mounting pad 22.

When it is desired to mount the etalon diode 16, the diode 16 is placed on the solder pad 22 on one of the plates such as plate 12 in FIG. 3. Thereafter, a stack including a sheet of plastic 24, a filler sheet 26 and another plastic sheet 28 is placed on the plate 12. Each of the sheets 24, 26 and 28 have a cutout 30 for clearance about the solder pad 22. The other mounting plate 14 then is placed on the sheet 28 and the entire assembly is heated. The heat solders the diode 16 by its metal contacts 16a and 16b to the solder pads 22 at the same time and temperature the plastic sheets 24 and 28 act as thermally activated adhesive to adhesively bond the mounting plates 12 and 14 together with the filler sheet 26 therebetween. The thickness of the sheets 24, 26 and 28 are chosen to approximate the thickness of the diode 16 and the solder pads 22 so that the mounting plates 12 and 14 are essentially parallel in the assembly 11. By mounting an etalon diode 16 in this manner, it is ruggedly supported and the etalon is maintained in alignment during the soldering process, normally a very difficult problem. This mounting enables heat to be dissipated therefrom on both sides through the solder pads 22 into the plates 12 and 14 during operation of the diode 16.

As shown in FIG. 5, this type of arrangement is adaptable to more standard mountings such as the modified TO-5 mounting 30 shown. A portion 32 of the slug end 34 of the mounting 30 is milled off to form a platform 36 which corresponds to plate 12. Thereafter, the diode 16 is mounted as described above with the filler layers 24, 26 and 28 being incorporated as a filler layer 38 and the upper mounting plate 14 being incorporated as the plate 40 shown.

As shown in FIG. 4, the diode 16 is mounted with its output end 44 extending beyond the mounting plates 12 and 14. This is to eliminate diffraction of the output which could be caused by the reflective adjacent surface should either the mounting plate 12 or 14 extend beyond the output end 44 thereof.

The internal etalon diode 16 is formed by cracking a single diode chip so that an etalon is formed in the optical cavity. In practice, the two pieces are not physically separated but are held together by one of the metallic surfaces which is not physically broken.

The configuration of a typical etalon laser diode 16 is shown in FIG. 6. A 20 mM stripe 42 was employed from the output end 44 to the reflective end 46 of the diode 16, the cavity distance therebetween being 20 mils. The diode was cracked about 13 mils from its output end 44, the crack 48 forming an internal etalon. When mounted as discussed above, the diodes 16 resulted with the two sections 50 and 52 soldered in close proximity to obtain close coupling of the two cavities 54 and 56 formed therein along the stripe 42. FIG. 7 shows a typical frequency spectrum obtained with this type diode and FIG. 8 shows the far field pattern at the same current level. Diodes, such as diode 16 run single frequency at any current setting even though they can change transverse mode pattern or run multimode. The small ripples 60 to the right of the main peak 62 are the result of higher mode oscillation. The diode 16 does jump to a higher or lower wavelength as the temperature is shifted as shown in FIG. 9, wherein its frequency versus temperature is plotted versus that of a standard laser diode constructed without an internal etalon. The temperature must change enough to shift the gain line to a new wavelength wherein the two subcavities 54 and 56 are jointly resonant. Depending upon the exact ratio of the length of the two subcavities 54 and 56, this temperature interval can be almost any interval. In the case shown in FIG. 9, the measured shift of the diode 16 of FIG. 6 was expanded to more than $\pm 3°$ C. and the frequency stability during current excursions was correspondingly improved.

The shortening of the laser diode cleave length has three distinctive effects on diode output characteristics. The diode efficiently improves because of improved output coupling to internal loss ratio, the diode internal transverse mode pattern simplifies and the adjacent longitudinal mode spacing increases. When the diode cleave length is made as short as 4 mils, a very large percentage of fabricated diodes 16 can be expected to run single frequency. In addition, they also run single transverse mode. Unfortunately, a stripe 42 with a width of 20 mM allows the second order mode to run and a very narrow stripe 42 would be required to limit operation to the fundamental mode in a diode 16 is short as 4 mils.

Two modified diode configurations 70 and 72 are shown in FIGS. 10 and 11. The diode 70 includes a stripe 74 having a parallel edge portion 76 adjacent the reflective end thereof which extends to the etaloning crack 80 and thereafter the stripe 74 is trumpet shaped or divergent to the output end 84. The trumpet shape of the stripe portion 82 enables more photons to be generated and hence a higher output. The same principle is applied to the diode 72 wherein two internal etalons are formed by the cracks 86 and 88 which cross the stripe 90 at its parallel edge portion 91 so that its trumpet stripe portion 92 extends from the intermediate crack 88 to the output end 94 thereof. The two internal etalons 96 and 98 are useful when it is desired to provide a very high power diode 72 oscillating in a single longitudinal mode.

Thus there has been shown and described novel laser diodes having internal etalons which fulfills all of the objects and advantages sought therefor. Many changes, modifications, variations, alterations and other uses and applications of the subject diodes will become apparent to those skilled in the art after considering the foregoing specification and drawings. All such changes, modifications, variations and other uses and applications which do not depart from the spirit and scope of the invention are deemed to be covered by the invention which is limited only by the claims which follow.

What is claimed is:

1. A stripe geometry semiconductor laser diode for producing a light output, said diode being comprised of a body of semiconductor material having:
    first and second electrodes connected thereto;
    front and rear surfaces;
    optical cavity means in the form of a stripe, extending between said front and rear surfaces, said output of said diode emitting from said front surface thereof; and
    a first crack through said body generally parallel to said front and rear surfaces to form an etalon therein.

2. The stripe geometry semiconductor laser diode as defined in claim 1 further including:
    first and second metallic contact surfaces on said body forming said first and second electrodes, said first crack extending through said second metallic contact surface.

3. The stripe geometry semiconductor laser diode as defined in claim 2 wherein said optical cavity means include:
    an oxide striped current confinement region adjacent said first metallic contact, said first crack extending across said oxide striped current confinement region.

4. The stripe geometry semiconductor laser diode as defined in claim 3 wherein said oxide striped current confinement region has:
    a first portion with parallel sides which extend from said rear surface of said body a predetermined distance therefrom, said first portion having a width which is relatively narrow with respect to its length; and
    a second portion with divergent sides which extend from said first portion to said front surface of said body, said second portion having an average width which is relatively narrow with respect to its length whereby said diode is capable of operation in single transverse and single longitudinal modes.

5. The stripe geometry semiconductor laser diode as defined in claim 4 wherein said first crack is positioned between said first and second portions.

6. The stripe geometry semiconductor laser diode as defined in claim 5 further including:
    a second crack in said body generally parallel to said front and rear surfaces between said rear surface and said first crack.

7. The stripe geometry semiconductor laser diode as defined in claim 6 wherein the distance between said first crack and said second crack is different than the distance between said second crack and said rear surface.

8. The stripe geometry semiconductor laser diode as defined in claim 5 wherein said first crack separates said oxide striped current confinement region into two portions having unequal ratios so that laser cavity resonances occur more than two nanometers apart in wavelength.

9. The stripe geometry semiconductor laser diode as defined in claim 2 including a mounting comprised of:
    first and second mounting plates, each mounting plate having a solder pad of a predetermined shape thereon, said laser diode being soldered by said first and second metallic contacts thereof between said first and second mounting plates to said solder pads;
    at least one spacer positioned between said mounting plates; and adhesive to retain said spacer to said mounting plates.

10. The stripe geometry semiconductor laser diode as defined in claim 9 wherein said first and second mounting plates have edges, said front surface of said diode extending beyond said edges of said first and second mounting plates.

11. The stripe geometry semiconductor laser diode as defined in claim 1 further including:

first and second metallic contact surfaces on said body forming said first and second electrodes respectively, said first crack extending through said second metallic contact surface and said body only.

12. The stripe geometry semiconductor laser diode as defined in claim 11 wherein said optical cavity means include:

an oxide striped current confinement region adjacent said first metallic contact, said first crack extending across said oxide striped current confinement region.

13. The stripe geometry semiconductor laser diode as defined in claim 12 wherein said oxide striped current confinement region has:

a first portion with parallel sides which extend from said rear surface of said body a predetermined distance therefrom, said first portion having a width which is relatively narrow with respect to its length; and a second portion with divergent sides which extend from said first portion to said front surface of said body, said second portion having an average width which is relatively narrow with respect to its length whereby said diode is capable of operation in single transverse and single longitudinal modes.

14. The stripe geometry semiconductor laser diode as defined in claim 13 wherein said first crack is positioned between said first and second portions.

15. The stripe geometry semiconductor laser diode as defined in claim 14 further including:

a second crack in said body generally parallel to said front and rear surfaces between said rear surface and said first crack, said second crack extending through said second metallic contact surface and said body only.

16. The stripe geometry semiconductor laser diode as defined in claim 15 wherein the distance between said first crack and said second crack is different than the distance between said second crack and said rear surface.

17. The stripe geometry semiconductor laser diode as defined in claim 14 wherein said first crack separates said oxide striped current confinement region into two portions having unequal ratios so that laser cavity resonances occur more than two nanometers apart in wavelength.

18. The stripe geometry semiconductor laser diode as defined in claim 11 including a mounting comprised of:

first and second mounting plates, each mounting plate having a solder pad of a predetermined shape thereon, said laser diode being soldered by said first and second metallic contacts thereof between said first and second mounting plates to said solder pads;

at least one spacer positioned between said mounting plates; and adhesive to retain said spacer to said mounting plates.

19. The stripe geometry semiconductor laser diode as defined in claim 18 wherein said first and second mounting plates have edges, said front surface of said diode extending beyond said edges of said first and second mounting plates.

* * * * *